United States Patent
Kim et al.

(10) Patent No.: US 9,093,403 B2
(45) Date of Patent: Jul. 28, 2015

(54) ORGANIC LIGHT-EMITTING DISPLAY APPARATUS HAVING A MIRROR FUNCTION

(71) Applicant: SAMSUNG DISPLAY CO., LTD., Yongin, Gyeonggi-do (KR)

(72) Inventors: Kyung-Ho Kim, Yongin (KR); Jin-Koo Chung, Yongin (KR); Sang-Hoon Yim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/051,106

(22) Filed: Oct. 10, 2013

(65) Prior Publication Data

US 2014/0367646 A1 Dec. 18, 2014

(30) Foreign Application Priority Data

Jun. 18, 2013 (KR) .................. 10-2013-0069954

(51) Int. Cl.
*H01L 29/08* (2006.01)
*H01L 27/32* (2006.01)
*H01L 51/52* (2006.01)

(52) U.S. Cl.
CPC ........... *H01L 27/3246* (2013.01); *H01L 51/524* (2013.01); *H01L 51/5253* (2013.01); *H01L 51/5271* (2013.01); *H01L 51/5281* (2013.01)

(58) Field of Classification Search
CPC ........................ H01L 27/32; H01L 2227/32
USPC .......................................................... 257/40
See application file for complete search history.

(56) References Cited

U.S. PATENT DOCUMENTS

| 2003/0038594 A1* | 2/2003 | Seo et al. .................. 313/506 |
| 2003/0151354 A1* | 8/2003 | Takizawa .................. 313/498 |
| 2011/0204388 A1 | 8/2011 | Jeong et al. |
| 2012/0299472 A1 | 11/2012 | Chung et al. |

FOREIGN PATENT DOCUMENTS

| KR | 10-2009-0099744 | 9/2009 |
| KR | 10-1071712 | 10/2011 |
| KR | 10-1125569 | 3/2012 |

OTHER PUBLICATIONS

Publication 10-2006-0028251 (for 10-1071712).
US 2011/0204388 Related to KR10-1125569.
US 2012/0299472 Related to KR10-2009-0097744.

* cited by examiner

*Primary Examiner* — Shaun Campbell
(74) *Attorney, Agent, or Firm* — F. Chau & Associates, LLC

(57) ABSTRACT

An organic light-emitting display apparatus includes a first substrate. Pixels are formed on the first substrate. The pixels have a light-emitting region and a non-light-emitting region. A second substrate faces the first substrate. A reflective member is disposed on the second substrate. The reflective member includes openings corresponding to the light-emitting regions of the pixels and reflective portions corresponding to the non-light-emitting regions of the pixels. Each pixel includes a first electrode in the light-emitting region, a second electrode facing the first electrode, an organic layer between the first electrode and second electrode, and a pixel-defining layer covering edges of the first electrode. The pixel-defining layer is formed in the non-light-emitting region, and has a sidewall slope that provides an external light reflection path that is similar to that of the light-emitting region.

14 Claims, 3 Drawing Sheets

ORGANIC LIGHT-EMITTING DISPLAY APPARATUS HAVING A MIRROR FUNCTION

CROSS-REFERENCE TO RELATED PATENT APPLICATION

This application claims the benefit of Korean Patent Application No. 10-2013-0069954, filed on Jun. 18, 2013, in the Korean Intellectual Property Office, the disclosure of which is herein incorporated by reference in its entirety.

TECHNICAL FIELD

The present invention relates to an organic light-emitting display apparatus, and more particularly, to an organic light-emitting display apparatus realizing a mirror function.

DISCUSSION OF THE RELATED ART

Recently, there is a trend to utilize portable, thin flat display apparatuses. Attempts have been made to provide a display apparatus that is capable of reflecting light like a mirror when desired. For example, the display may show an image when desired and may reflect light as a mirror when desired.

One such approach is to apply a semi-transparent/partially reflective mirror coating to the external surface of the display apparatus to realize a mirror function. However, since the coating may reduce the amount of light transmitted through the display device, transmission efficiency may decrease, thereby compromising the viewability of the display device. Moreover, because the mirror coating is only partially reflective, the reflection efficiency may be suboptimal. For example, the mirror effect may be reduced. Accordingly, this approach may produce a display device with a relatively poor quality mirror effect and a display having reduced quality.

SUMMARY OF THE INVENTION

The present invention provides a display apparatus that may provide a mirror function having a relatively high degree of reflectance while not deteriorating display quality and efficiency.

According to an aspect of the present invention, there is provided an organic light-emitting display apparatus including a plurality of pixels which are formed on a first substrate. The pixels each have a light-emitting region and a non-light-emitting region. A reflective member is disposed on a surface of a second substrate facing the first substrate. The reflective member includes an opening corresponding to the light-emitting region and a reflective portion corresponding to the non-light-emitting region. Each pixel may include a first electrode formed in the light-emitting region. A second electrode faces the first electrode. An organic layer is formed on the first electrode. The organic layer includes a light-emitting layer. A pixel-defining layer covers edges of the first electrode, is formed in the non-light-emitting region, and has a sidewall slope forming an external light reflection path that is close to an external light reflection path in the light-emitting region.

The sidewall slope of the pixel-defining layer may be about 90 degrees or more.

The second electrode and the organic layer excluding the light-emitting layer may be disposed by extending onto the pixel-defining layer. The organic light-emitting display apparatus may further include a capping layer formed on the second electrode.

The second electrode and the organic layer excluding the light-emitting layer may be disposed by extending onto the pixel-defining layer and may be disconnected from an inclined surface of the pixel-defining layer. The organic light-emitting display apparatus may further include a capping layer, which overlaps the light-emitting region, exposes edges of the second electrode, and is formed on the second electrode. A conductive layer is formed on the second electrode and is in contact with the exposed edges of the second electrode.

The conductive layer need not be formed on the capping layer.

The capping layer may be formed of organic materials of a triarylamine derivative (EL301), 8-quinolinolato lithium (Liq), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

The conductive layer may include a conductive material having low adhesion to a material constituting the capping layer.

The conductive layer may be formed of magnesium (Mg) or an Mg alloy.

According to an aspect of the present invention, there is provided an organic light-emitting display apparatus including a first substrate including a plurality of pixels each having a light-emitting region, in which a first electrode, a second electrode, and an organic layer including a light-emitting layer disposed between the first electrode and the second electrode are formed, and a non-light-emitting region around the light-emitting region. A pixel-defining layer that covers edges of the first electrode and has a sidewall slope forming an external light reflection path that is close to an external light reflection path in the light-emitting region is disposed in the non-light-emitting region. A second substrate includes a reflective member formed therein on a surface of the second substrate facing the first substrate. The reflective member includes an opening corresponding to the light-emitting region and a reflective portion corresponding to the non-light-emitting region.

The sidewall slope of the pixel-defining layer may be about 90 degrees or more.

The second electrode and the organic layer excluding the light-emitting layer may be formed on an entire surface of the first substrate. The organic light-emitting display apparatus may further include a capping layer formed on the second electrode.

The second electrode and the organic layer excluding the light-emitting layer may be formed on the entire surface of the first substrate and may be disconnected from an inclined surface of the pixel-defining layer. The organic light-emitting display apparatus may further include a capping layer, which overlaps the light-emitting region, exposes edges of the second electrode, and is formed on the second electrode. A conductive layer is formed on the second electrode and is in contact with the exposed edges of the second electrode.

The conductive layer might not be formed on the capping layer.

The capping layer may be formed of organic materials of a triarylamine derivative (EL301), 8-quinolinolato lithium (Liq), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

The conductive layer may include a conductive material having low adhesion to a material constituting the capping layer.

The conductive layer may be formed of magnesium (Mg) or an Mg alloy.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE INVENTION

Figure 1:
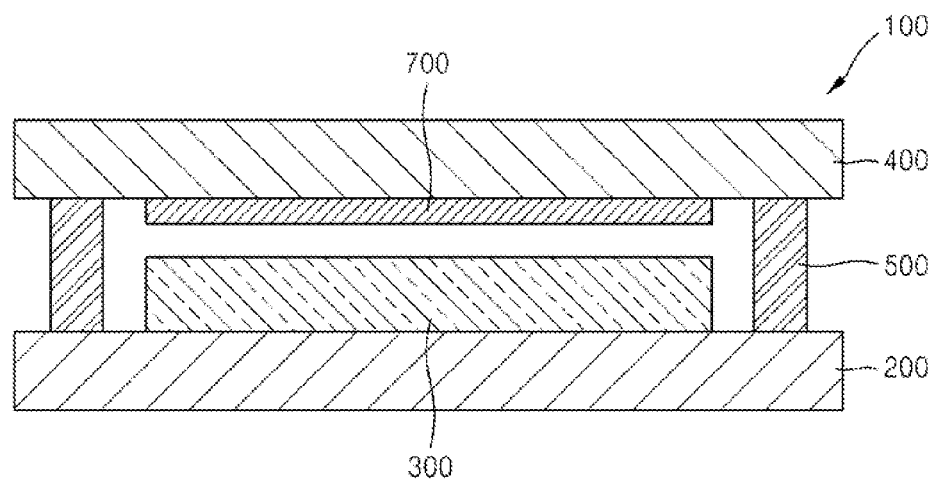
FIG. 1 is a cross-sectional view schematically illustrating an organic light-emitting display apparatus according to an embodiment of the present invention.

While the invention is amenable to various modifications and alternative forms, specific embodiments have been shown by way of example in the drawings and are described in detail below. The intention, however, is not limited to the particular embodiments described herein. On the contrary, the invention is intended to cover all modifications, equivalents, and alternatives. Like reference numerals in the drawings may denote like elements. In the figures illustrating embodiments of the present invention, the dimensions of layers and regions may be exaggerated for clarity of illustration. Also, it will be understood that when an element such as a layer, film, region, or substrate is referred to as being "on" another element, it can be directly on the other element or intervening elements may also be present.

Hereinafter, the constitution and operation of the present invention will be described in detail with reference to embodiments of the present invention illustrated in the attached drawings.

Figure 2:
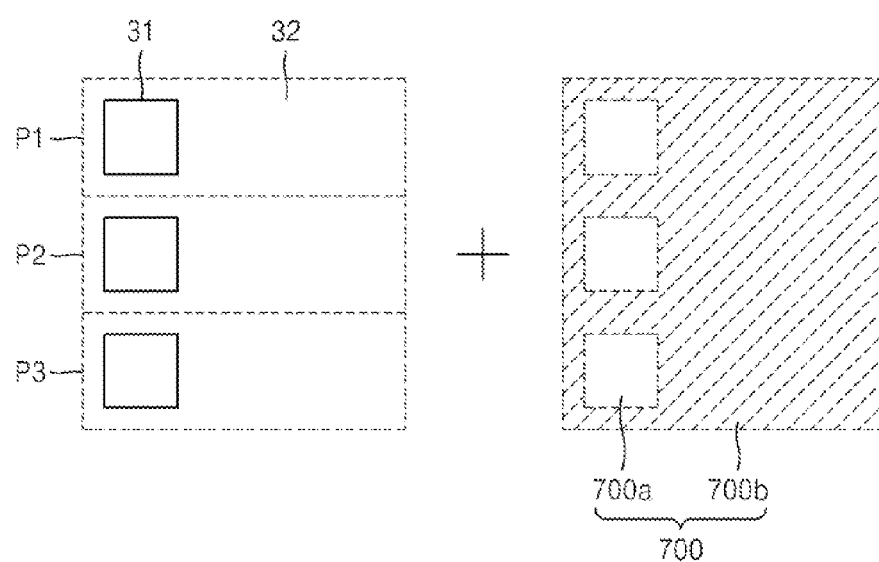
FIG. 2 is a cross-sectional view illustrating pixels of a display unit of the organic light-emitting display apparatus in FIG. 1.

FIG. 1 is a cross-sectional view schematically illustrating an organic light-emitting display apparatus 100 according to an embodiment of the present invention, and FIG. 2 is a cross-sectional view illustrating pixels of a display unit 300 of the organic light-emitting display apparatus 100 in FIG. 1.

Referring to FIG. 1, the organic light-emitting display apparatus 100 according to an embodiment of the present invention includes a first substrate 200 including the display unit 300 and a second substrate 400 including a reflective member 700.

The first substrate 200 and the second substrate 400 are bonded to each other by a sealing member 500. An absorbent or a filler may be disposed in a space that is formed between the first substrate 200 and the second substrate 400 by the sealing member 500.

The first substrate 200 and the second substrate 400 may be formed of a transparent glass material including $SiO_2$ as a main component. However, the first substrate 200 and the second substrate 400 are not necessarily limited thereto, and the first substrate 200 and the second substrate 400 may be formed of a transparent plastic material.

The display unit 300 on the first substrate 200 includes a plurality of pixels P1, P2, and P3. Each of the pixels P1, P2, and P3 includes a light-emitting region 31 and a non-light-emitting region 32.

The light-emitting region 31 is a region in which a light-emitting device directly emits visible light to form an image that is recognized by a user. The light-emitting region 31 may be formed in various shapes. The non-light-emitting region 32 is formed around the light-emitting region 31 and is adjacent to the light-emitting region 31. A circuit for driving the light-emitting region 31 may be disposed in the non-light-emitting region 32 or may be disposed to overlap the light-emitting region 31. Although not illustrated in FIG. 2, each of the pixels P1, P2, and P3 may also include a transmission region or a common transmission region in the non-light-emitting region 32. The transmission region may be formed by making a transmission window in one or more insulating layers formed on the first substrate 200. Also, the transmission region may be formed by making a transmission window in one or more conductive layers formed on the first substrate 200.

The second substrate 400 is an encapsulation member sealing the display unit 300. The reflective member 700 is formed on one surface of the second substrate 400 facing the first substrate 200. Referring to FIG. 2, the reflective member 700 includes an opening 700a and a reflective portion 700b around the opening 700a. The opening 700a is formed to correspond to the light-emitting region 31, and the reflective portion 700b is formed to correspond to the non-light-emitting region 32. The reflective member 700 may be formed to extend to a region in which the sealing member 500 is disposed, or to an outer region of the sealing member 500 by overlapping the sealing member 500.

The reflective portion 700b may have a desired degree of reflectance. The reflective portion 700b may have a reflectance that is substantially the same as a reflectance of each of the pixels P1, P2, and P3, particularly, a reflectance of the light-emitting region 31. For example, a difference between the reflectance of the reflective portion 700b and the average reflectance of the light-emitting region 31 may be within about 10%. As a result, the organic light-emitting display apparatus 100, according to the present invention, may simultaneously realize a mirror function as well as an image display function. Also, the reflective portion 700b may have a desired thickness to support the desired degree of reflectance.

Figure 3:
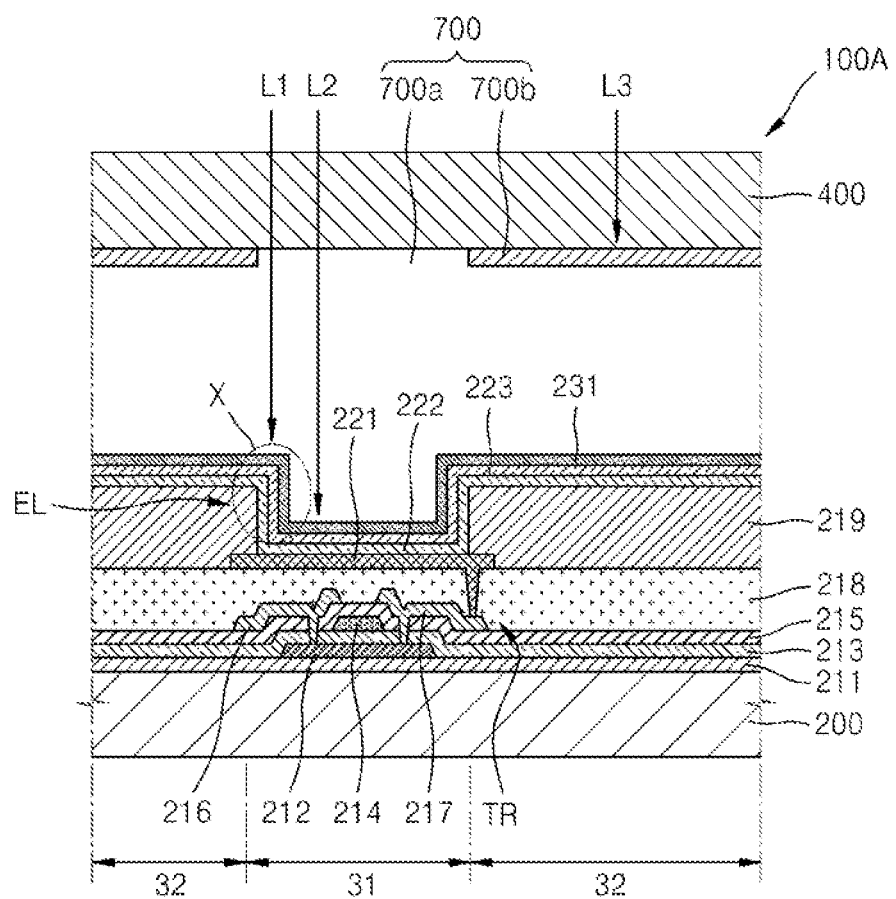
FIG. 3 is a cross-sectional view illustrating a single pixel of an organic light-emitting display apparatus, according to an embodiment of the present invention.

FIG. 3 is a cross-sectional view illustrating a single pixel of an organic light-emitting display apparatus 100A, according to an embodiment of the present invention.

The organic light-emitting display apparatus 100A includes a first substrate 200, including a display unit, and a second substrate 400 facing the first substrate 200. The first substrate 200 and the second substrate 400 are bonded together by a sealing member (not shown).

The display unit on the first substrate 200 includes a plurality of pixels. Referring to FIG. 3, the single pixel includes a light-emitting region 31 and a non-light-emitting region 32.

An organic light-emitting device EL as a light-emitting device and a thin film transistor TR under the EL as a pixel circuit for driving a pixel are disposed in the light-emitting region 31 of the pixel formed on the first substrate 200. The EL includes a first electrode 221, a second electrode 223, and an organic layer 222. The EL is electrically connected to the TR thereunder. The TR includes an active layer 212, a gate electrode 214, a source electrode 216, and a drain electrode 217.

The single TR is disposed as a pixel circuit in FIG. 3. However, the present invention is not limited thereto, and plurality of thin film transistors and storage capacitors may be further included, and interconnections, such as scan lines, data lines, and power lines, connected thereto may be further included.

A buffer layer 211 is formed on the first substrate 200, and the active layer 212 is formed on the buffer layer 211. The buffer layer 211 may optionally be omitted. The active layer 212 may be formed of an inorganic semiconductor, such as amorphous silicon or polysilicon, an oxide semiconductor, or an organic semiconductor. The active layer 212 includes a source region and a drain region, which are each doped with impurities. A channel region may be located between the source and drain regions.

A gate dielectric layer 213 is formed on the active layer 212, and the gate electrode 214 is formed on the gate dielectric layer 213. The gate dielectric layer 213 insulates the gate electrode 214 from the active layer 212. The gate dielectric layer 213 may be formed of an organic material or an inorganic material, such as $SiN_x$ and $SiO_2$.

The gate electrode 214 is formed to correspond to the center of the active layer 212. The gate electrode 214 may contain gold (Au), silver (Ag), copper (Cu), nickel (Ni), platinum (Pt), palladium (Pd), aluminum (Al), and/or molybdenum (Mo), and may include Ag, magnesium (Mg), Al, Pt, Pd, Au, Ni, neodymium (Nd), iridium (Ir), chromium (Cr), lithium (Li), calcium (Ca), Mo, titanium (Ti), tungsten (W), MoW, and/or Cu. However, the present invention is not limited thereto, and the gate electrode 214 may be formed of various materials in consideration of adhesion with adjacent layers, flatness, electrical resistance, and processability. The gate electrode 214 may be formed as a single layer or multilayer.

An interlayer dielectric 215 is formed on the gate electrode 214. The interlayer dielectric 215 may be formed of an inorganic insulating material, or one or more organic insulating materials, for example, polyimide, polyamide, an acryl resin, benzocyclobutene, and/or a phenol resin. The interlayer dielectric 215 may also be formed by alternatingly stacking an organic insulating material and an inorganic insulating material.

The interlayer dielectric 215 and the gate dielectric layer 213 are formed to expose the source region and the drain region of the active layer 212, and the source electrode 216 and the drain electrode 217 are formed to be in contact with the exposed source region and drain region of the active layer 212. The source electrode 216 and the drain electrode 217 may be formed of the same conductive material as the gate electrode 214. However, the source electrode 216 and the drain electrode 217 are not limited thereto, and may be formed of various conductive materials. The source electrode 216 and the drain electrode 217 may have a single layer structure or a multilayer structure.

A passivation layer 218, which may be formed of an insulating layer, is formed to cover the TR. The passivation layer 218 may be formed of an inorganic material and/or an organic material.

The first electrode 221 of the EL, which is electrically connected to the TR, is formed on the passivation layer 218. The first electrode 221 is disposed to cover the TR by overlapping the TR.

A pixel-defining layer 219, which is formed of an organic insulating material and/or an inorganic insulating material and covers edges of the first electrode 221, is formed on the passivation layer 218. In this case, an angle of an inclined surface X of a sidewall (hereinafter, referred to as "sidewall slope") of the pixel-defining layer 219 covering the edges of the first electrode 221 is set to be equal to or greater than a right angle (90 degrees).

In a case where the sidewall slope of the pixel-defining layer 219 is set to be less than about 90 degrees, especially, about 30 degrees or less, the haze of a reflected image is increased due to the fact that reflection path characteristics of external light L1 incident on the inclined surface differ from reflection path characteristics of external light L2 incident on the light-emitting region 31, and thus, mirror qualities may be deteriorated. In the present embodiment, since the sidewall slope of the pixel-defining layer 219 is set to obtain an external light reflection path that is close to an external light reflection path in the light-emitting region 31, external light reflection having different reflection path characteristics may be removed. As a result, mirror qualities may be improved by decreasing the haze of the reflected image.

The organic layer 222 and the second electrode 223 are sequentially stacked on the first electrode 221.

The first electrode 221 may be formed in a stack structure of a transparent conductor and a reflective layer. Herein, the transparent conductor may include a high work function material, such as indium tin oxide (ITO), indium zinc oxide (IZO), ZnO, or $In_2O_3$. The reflective layer may include Ag, Mg, Al, Pt, Pd, Au, Ni, Nd, Ir, Cr, Li, Ca, Mo, and/or an alloy thereof.

The second electrode 223 may be formed of Ag, Mg, Al, Pt, Pd, Au, Ni, Nd, Ir, Cr, Li, Ca, Mo, or an alloy thereof. Also, in some cases, the second electrode 223 may be formed of ITO, IZO, ZnO, or $In_2O_3$. Herein, the second electrode 223 may be formed as a thin film having a thickness ranging from about 100 Å to about 300 Å in order to have a high transmittance. Therefore, the EL is a top emission-type device, in which an image is formed in a direction of the second electrode 223.

The organic layer 222 may be formed by stacking an emissive layer (EML) and organic functional layers, such as a hole transport layer (HTL), a hole injection layer (HIL), an electron transport layer (ETL), and/or an electron injection layer (EIL), in a single or composite structure.

The EML is a patterned layer formed on the first electrode 221 of the EL. The EML is formed in the light-emitting region 31. The EML may be formed of a low molecular weight organic material or a polymer organic material. In a case where the EML separately emits red, green, and blue light, the EML may be separately patterned as a red light-emitting layer, a green light-emitting layer, and a blue light-emitting layer.

In a case where the EML emits white light, the EML may have a multilayer structure, in which the red light-emitting layer, the green light-emitting layer, and the blue light-emitting layer are stacked, or may have a single layer structure including a red light-emitting material, a green light-emitting material, and a blue light-emitting material, in order to emit white light.

The EML may include various light-emitting materials. Examples of the light-emitting material may be oxadiazole dimer dyes (Bis-DAPDXP), Spiro compounds (Spiro-DPVBi, Spiro-6P), triarylamine compounds, bis(styryl) amine (DPVBi, DSA), 4,4'-bis(9-ethyl-3-carbazobinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stylbene (DPAVB), 4,4'-bis[4-(diphenylamino)styryl]biphenyl (BDAVBi), or bis(3,5-difluoro-2-(2-pyridyl)phenyl-(2-carboxypyridyl)iridium III (FIrPic) (blue light-emitting materials); 3-(2-benzothiazolyl)-7-(diethylamino)coumarine (Coumarin 6), 2,3,6,7-tetrahydro-1,1,7,7,-tetramethyl-1H,5H,11H-10-(2-benzothiazolyl)quinolizino-[9,9a,1gh]coumarine (C545T), N,N'-dimethyl-quinacridone (DMQA), or tris(2-phenylpyridine) iridium(III)(Ir(ppy)$_3$) (green light-emitting materials); and tetraphenylnaphthacene (Rubrene), tris(1-phenylisoquinoline)iridium(III)(Ir(piq)3), bis(2-benzo[b]thiophene-2-yl-pyridine)(acetylacetonate)iridium(III) (Ir(btp)2(acac)), tris (dibenzoylmethane)phenanthroline europium(III) (Eu(dbm)

3(phen)), tris[4,4'-di-tert-butyl-(2,2)-bipyridine]ruthenium (III) complex (Ru(dtb-bpy)3*2(PF6)), DCM1, DCM2, europium(thenoyltrifluoroacetone)3 (Eu(TTA)3), or butyl-6-(1,1,7,7-tetramethyljulolidyl-9-enyl)-4H-pyran (CJTB) (red light-emitting materials). The light-emitting materials may alternatively be polymer light-emitting materials, and for example, may be aromatic compounds including polymers, such as phenylene-based, phenylene vinylene-based, thiophene-based, fluorine-based, or spiro-fluorene-based polymers, and nitrogen. However, the present invention is not limited thereto as any light-emitting materials may be used.

In some cases, the EML may include a light-emitting host and a light-emitting dopant. The light-emitting dopant may be formed of the above-described light-emitting material, and the light-emitting host may be formed of a fluorescent host material or a phosphorescent host material. Examples of the fluorescent host material may be tris(8-hydroxy-quinolinato) aluminum (Alq3), 9,10-di(naphthy-2-yl)anthracene (AND), 3-tert-butyl-9,10-di(naphthy-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9'-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9'-diarylfluorene)s (BDAF), and 4,4'-bis(2,2-diphenyl-ethene-1-yl)-4,4'-di-(tert-butyl)phenyl (p-TDPVBi). Examples of the phosphorescent host material include 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethylfluorene (DMFL-CBP), 4,4-bis(carbazol-9-yl)-9,9-bis(9-phenyl-9H-carbazol)fluorene (FL-4CBP), 4,4'-bis(carbazol-9-yl)-9,9'-di-tolyl-fluorene (DPFL-CBP), and 9,9-bis(9-phenyl-9H-carbazole)fluorene (FL-2CBP).

4,4'-bis[4-(di-p-tolylamino)styryl]biphenyl (DPAVBi), 9,10-di(naph-2-tyl)anthracene (ADN), or 3-tert-butyl-9,10-di(naph-2-tyl)anthracene (TBADN) may be used as the dopant material of the EML.

The organic functional layer is a common layer formed on an entire surface of the first substrate 200. The organic functional layer may be disposed between the EML and one of the first electrode 221 and the second electrode 223, and may be formed in the light-emitting region 31 and the non-light-emitting region 32.

The HIL may be formed in a predetermined thickness so that the injection of holes is facilitated, wherein the thickness of the HIL may be changed according to materials of other layers. The HIL may be formed of a phthalocyanine compound, such as copper phthalocyanine, or starburst-type amines, such as tris(4-carbazoyl-9-ylphenyl)amine (TCTA), 4,4',4''-tris-(3-methylphenylphenylamino)triphenylamine (m-MTDATA), and 1,3,5-tris[4-(3-methylphenylphenylamino)phenyl]benzene (m-MTDAPB).

The HTL has good hole mobility and facilitates the transportation of holes. Deposition and coating conditions of the HTL may vary according to a compound used, but may be selected from the range of conditions similar to that of formation of the HIL. The HTL may be formed of N,N'-bis(3-methylphenyl)-N,N'-diphenyl-[1,1-biphenyl]-4,4'-diamine (TPD) or N,N'-di(naphthalene-1-yl)-N,N'-diphenyl benzidine (α-NPD).

The ETL may allow efficient electron transportation to be provided by facilitating the transportation of electrons. The ETL may be formed by using Alq3.

The EIL may facilitate the injection of electrons, and may be formed by using a material, such as LiF, NaCl, CsF, Li$_2$O, BaO, or 8-quinolinolato lithium (Liq).

A capping layer 231 may be formed on the second electrode 223. The capping layer 231 may include an organic material, an inorganic material, or a mixture thereof, and may be formed on the second electrode 223 to increase viewing angle characteristics and increase an external luminous efficiency. Also, the capping layer 231 may prevent deterioration of the electrode and organic layer thereunder due to external moisture or oxygen. Examples of organic materials that may be used in the capping layer 231 include a triamine derivative, an arylene diamine derivative, Alq3, and/or CBP. Examples of inorganic materials that may be used in the capping layer 231 include ITO, IZO, SiO$_2$, SiN$_X$, Y$_2$O$_3$, WO$_3$, MoO$_3$, and/or Al$_2$O$_3$. The capping layer 231 may have a single layer structure formed of a material such as an organic material, an inorganic material, or a mixture thereof, or may have a multilayer structure of materials having different refractive indices. The capping layer 231 may be formed by a method, such as thermal deposition or coating.

The non-light-emitting region 32 is formed around the light-emitting region 31 and is adjacent to the light-emitting region 31. The non-light-emitting region 32 may include a transmission region. The transmission region may be formed by making a transmission window in the second electrode 223, and may be formed by making transmission windows in the second electrode 223 and the pixel-defining layer 219. In this case, the transmission window of the second electrode 223 may have the same pattern as the transmission window of the pixel-defining layer 219.

A reflective member 700 is formed on a surface of the second substrate 400 facing the first substrate 200. The reflective member 700 may be formed of a reflector, e.g., a material that may reflect external light L3, and may include a predetermined metal. For example, the reflective member 700 may contain Al, Cr, Ag, iron (Fe), Pt, mercury (Hg), Ni, W, vanadium (V), and/or Mo. The reflective member 700 includes an opening 700a and a reflective portion 700b around the opening 700a. The opening 700a corresponds to the light-emitting region 31, and the reflective portion 700b corresponds to the non-light-emitting region 32.

Figure 4:
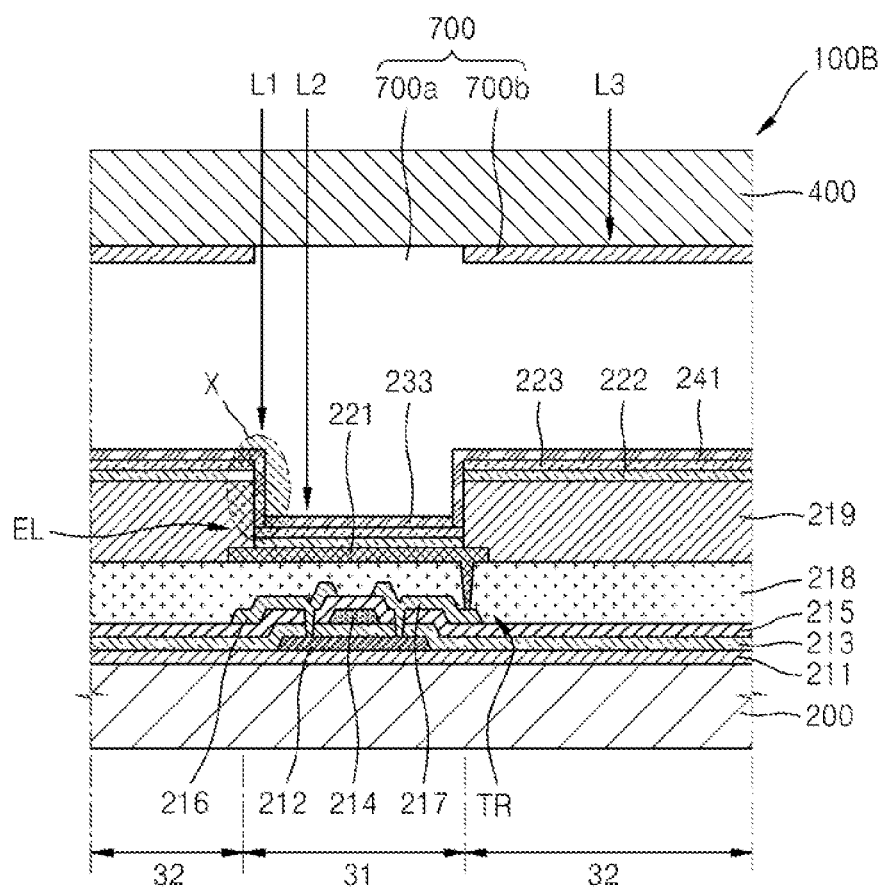
FIG. 4 is a cross-sectional view illustrating a single pixel of an organic light-emitting display apparatus, according to an embodiment of the present invention.

FIG. 4 is a cross-sectional view illustrating a single pixel of an organic light-emitting display apparatus 100B, according to an embodiment of the present invention.

The organic light-emitting display apparatus 100B includes a first substrate 200, including a display unit, and a second substrate 400 facing the first substrate 200. The first substrate 200 and the second substrate 400 are bonded by a sealing member (not shown).

The display unit on the first substrate 200 includes a plurality of pixels. Referring to FIG. 4, each single pixel includes a light-emitting region 31 and a non-light-emitting region 32. Descriptions of those elements that are similar or identical to those elements described above with respect to FIG. 3 are omitted.

First, a thin film transistor TR, including an active layer 212, a gate electrode 214, a source electrode 216, and a drain electrode 217, is formed. A passivation layer 218, including an insulating layer, is formed to cover the TR. A first electrode 221 of an organic light-emitting device EL, which is electrically connected to the TR, is formed on the passivation layer 218. The first electrode 221 is disposed to cover the TR by overlapping the TR. A pixel-defining layer 219, which is formed of an organic insulating material and/or an inorganic insulating material and covers edges of the first electrode 221, is formed on the passivation layer 218. In this case, a sidewall slope of the pixel-defining layer 219 covering the edges of the first electrode 221 is set to be equal to or greater than right angle (90 degrees).

In a case where the sidewall slope of the pixel-defining layer 219 is set to be less than about 90 degrees, especially, about 30 degrees or less, the haze of a reflected image is increased due to the fact that reflection path characteristics of external light L1 incident on an inclined surface of the pixel-defining layer 219 differ from reflection path characteristics of external light L2 incident on the light-emitting region 31, and thus, mirror qualities may be deteriorated. In the present embodiment, since the sidewall slope of the pixel-defining layer 219 is set to obtain an external light reflection path that is close to an external light reflection path in the light-emitting region 31, external light reflection having different reflection path characteristics may be removed. As a result, mirror qualities may be increased by decreasing the haze of the reflected image.

An organic layer 222 and a second electrode 223 are sequentially stacked on an entire surface of the first substrate 200, including the first electrode 221. The organic layer 222 in the light-emitting region 31 includes an organic light-emitting layer and an organic functional layer. The organic layer 222 in the non-light-emitting region 32 includes an organic functional layer and does not include the organic light-emitting layer. Since the sidewall slope of the pixel-defining layer 219 is 90 degrees or more, portions of the organic layer 222 and the second electrode 223 may be disconnected near an inclined surface X. Accordingly, a capping layer 233 is patterned to remain only on the second electrode 223 disposed in the light-emitting region 31. In this case, the capping layer 233 is formed to expose the edges of the second electrode 223 disposed in the light-emitting region 31 by being patterned in a smaller size than the second electrode 223 disposed in the light-emitting region 31. The capping layer 233 may be formed of an organic material.

Next, a conductive layer 241 is formed on the entire surface of the first substrate 200, on which the capping layer 233 is formed. The conductive layer 241 is in contact with the second electrode 223. The conductive layer 241 is formed on the second electrode 223 in the non-light-emitting region 32, and is also in contact with the second electrode 223 by filling edge regions of the second electrode 223 exposed by the capping layer 233 in the light-emitting region 31.

Here, the conductive layer 241 is formed of a conductive material having low adhesion to the organic material constituting the capping layer 233. As a result, the conductive layer 241 is not formed on the capping layer 233, and the conductive layer 241 may be formed only in a region in which the capping layer 233 does not exist. For example, the capping layer 233 may be formed of organic materials, such as a triarylamine derivative (EL301), Liq, N(diphenyl-4-yl)9,9-dimethyl-N-(4(9-phenyl-9H-carbazol-3-yl)phenyl)-9H-fluorene-2-amine (HT211), and 2-(4-(9,10-di(naphthalene-2-yl)anthracene-2-yl)phenyl)-1-phenyl-1H-benzo-[D] imidazole (LG201), and the conductive layer 241 may be formed of Mg or an Mg alloy.

According to an exemplary embodiment, the sidewall slope of the pixel-defining layer 219 is set to be about 90 degrees or more, and thus, the reflection path characteristics of the external light L1 incident on the inclined surface of the pixel-defining layer 219 may match with the reflection path characteristics of the external light L2 incident on the light-emitting region 31. Also, the patterned capping layer 233 and the conductive layer 241 may increase luminous efficiency and simultaneously, may prevent an electrical disconnection failure of the second electrode 223. Furthermore, since the insulating organic material and the conductive material having low mutual adhesion are respectively used in the formation of the capping layer 233 and the conductive layer 241, the conductive layer 241 may be formed only in the region in which the capping layer 233 is not formed, without using an additional mask.

The non-light-emitting region 32 is formed around the light-emitting region 31 to be adjacent to the light-emitting region 31. The non-light-emitting region 32 may include a transmission region.

A reflective member 700 is formed on a surface of the second substrate 400 facing the first substrate 200. The reflective member 700 may be formed of a reflector, e.g., a material that may reflect external light L3, and may include a predetermined metal. The reflective member 700 includes an opening 700a and a reflective portion 700b around the opening 700a. The opening 700a corresponds to the light-emitting region 31, and the reflective portion 700b corresponds to the non-light-emitting region 32.

In the foregoing embodiment, a pixel circuit for driving a pixel is disposed to overlap a light-emitting region. However, the present invention is not limited thereto, and the pixel circuit may be disposed in the non-light-emitting region.

According to an exemplary embodiment of the present invention, the angle of the inclined surface is set to be high at about 90 degrees or more in the outer part of the light-emitting region of a display apparatus, and thus, the haze of an image due to the external light reflection on the inclined surface may be decreased and light reflective qualities for the mirror function of the display apparatus may be increased.

Since an organic light-emitting display apparatus according to an exemplary embodiment of the present invention may allow external light reflection characteristics of a light-emitting region to be uniform by increasing a sidewall slope of a pixel-defining layer, the organic light-emitting display apparatus may realize a mirror display function by maximizing reflectance and reflective qualities while not deteriorating display quality and efficiency.

While specific embodiments of the present invention have been particularly shown and described, various modifications and substitutions may be made thereto within the scope of the present invention. Although not illustrated, equivalent means of practicing the present invention are also within the scope and spirit of the present invention.

What is claimed is:
1. An organic light-emitting display apparatus comprising:
a first substrate;
a plurality of pixels formed on the first substrate, wherein each of the plurality of pixels has a light-emitting region and a non-light-emitting region;
a second substrate facing the first substrate; and
a reflective member disposed on a surface of the second substrate that faces the first substrate, the reflective member including a plurality of openings corresponding to the light-emitting regions of the plurality of pixels and a plurality of reflective portions corresponding to the non-light-emitting regions of the plurality of pixels,
wherein each pixel comprises:
a first electrode formed in the light-emitting region;
a second electrode facing the first electrode;
an organic layer formed between the first electrode and second electrode, the organic layer including a light-emitting layer; and
a pixel-defining layer covering edges of the first electrode, wherein the pixel-defining layer is formed in the non-light-emitting region, and has a sidewall slope that pro- vides an external light reflection path that is substantially the same as an external light reflection path of the light-emitting region, wherein the second electrode and the organic layer extend onto the pixel-defining layer and are disconnected along the sidewall of the pixel-defining layer, and each pixel further comprises:

a capping layer formed on the second electrode in the light-emitting region and exposing edges of the second electrode in the light-emitting region, and a conductive layer formed on the second electrode in the non-light-emitting region and is in contact with the exposed edges of the second electrode in the light-emitting region.

2. The organic light-emitting display apparatus of claim 1, wherein the sidewall slope of the pixel-defining layer is greater than or equal to 90 degrees.

3. The organic light-emitting display apparatus of claim 1, wherein the organic layer excluding the light-emitting layer extends onto the pixel defining layer.

4. The organic light-emitting display apparatus of claim 1, wherein the conductive layer does not extend to the capping layer.

5. The organic light-emitting display apparatus of claim 1, wherein the capping layer includes organic materials of a triarylamine derivative (EL301), 8-quinolinolato lithium (Liq), N(diphenyl-4-yl)9,9-dimethyl-N-(4(9-phenyl-9H-carbazol-3-yl)phenyl)-9H-fl-uorene-2-amine (HT211), or 2-(4-(9,10-di(naphthalene-2-yl)anthracene-2-yl)phenyl)-1-phenyl-1H-benzo--[D]imidazole (LG201).

6. The organic light-emitting display apparatus of claim 1, wherein the conductive layer comprises a conductive material having low adhesion to a material constituting the capping layer.

7. The organic light-emitting display apparatus of claim 1, wherein the conductive layer is formed of magnesium (Mg) or an Mg alloy.

8. An organic light-emitting display apparatus comprising:

a first substrate including a plurality of pixels each having a light-emitting region, in which a first electrode, a second electrode, and an organic layer including a light-emitting layer disposed between the first electrode and the second electrode are formed, and a non-light-emitting region around the light-emitting region, wherein a pixel-defining layer that covers edges of the first electrode and has a sidewall slope forming an external light reflection path that is substantially the same as an external light reflection path in the light-emitting region is disposed in the non-light-emitting region; and a second substrate, in which a reflective member is formed on a surface of the second substrate that faces the first substrate, wherein the reflective member includes an opening corresponding to the light-emitting region and a reflective portion corresponding to the non-light-emitting region, wherein the second electrode and the organic layer are formed on the entire surface of the first substrate and are disconnected along the sidewall of the pixel-defining layer, and further comprising:

a capping layer formed on the second electrode in the light-emitting region and exposing edges of the second electrode in the light-emitting region, and a conductive layer formed on the second electrode in the non-light-emitting region and is in contact with the exposed edges of the second electrode in the light-emitting region.

9. The organic light-emitting display apparatus of claim 8, wherein the sidewall slope of the pixel-defining layer is greater than or equal to 90 degrees.

10. The organic light-emitting display apparatus of claim 8, wherein the organic layer is formed on the entire surface of the first substrate excluding the light-emitting layer.

11. The organic light-emitting display apparatus of claim 8, wherein the conductive layer does not extend to the capping layer.

12. The organic light-emitting display apparatus of claim 8, wherein the capping layer includes organic materials of a triarylamine derivative (EL301), 8-quinolinolato lithium (Liq), N(diphenyl-4-yl)9,9-dimethyl-N-(4(9-phenyl-9H-carbazol-3-yl)phenyl)-9H-fl-uorene-2-amine (HT211), of 2-(4-(9,10-di(naphthalene-2-yl)anthracene-2-yl)phenyl)-1-phenyl-1H-benzo--[D]imidazole (LG201).

13. The organic light-emitting display apparatus of claim 8, wherein the conductive layer comprises a conductive material having low adhesion to a material constituting the capping layer.

14. The organic light-emitting display apparatus of claim 8, wherein the conductive layer is formed of magnesium (Mg) or an Mg alloy.

* * * * *